United States Patent
Parthasarathy et al.

(10) Patent No.: US 11,301,231 B2
(45) Date of Patent: Apr. 12, 2022

(54) DYNAMIC RUN TIME PROGRAMMING OF HARDWARE TABLES

(71) Applicant: Arista Networks, Inc., Santa Clara, CA (US)

(72) Inventors: Prasanna Parthasarathy, Cupertino, CA (US); Kenneth James Duda, Santa Clara, CA (US); Simon Francis Capper, San Jose, CA (US)

(73) Assignee: Arista Networks, Inc., Santa Clara, CA (US)

( * ) Notice: Subject to any disclaimer, the term of this patent is extended or adjusted under 35 U.S.C. 154(b) by 148 days.

(21) Appl. No.: 16/377,148

(22) Filed: Apr. 5, 2019

(65) Prior Publication Data

US 2020/0319875 A1    Oct. 8, 2020

(51) Int. Cl.
| | |
|---|---|
| *G06F 8/65* | (2018.01) |
| *G06F 8/41* | (2018.01) |
| *G06F 30/34* | (2020.01) |
| *G06F 30/347* | (2020.01) |
| *H04L 41/0803* | (2022.01) |
| *H04L 67/00* | (2022.01) |

(52) U.S. Cl.
CPC ............ *G06F 8/65* (2013.01); *G06F 8/41* (2013.01); *G06F 30/34* (2020.01); *G06F 30/347* (2020.01); *H04L 41/0803* (2013.01); *H04L 67/34* (2013.01)

(58) Field of Classification Search
None
See application file for complete search history.

(56) References Cited

U.S. PATENT DOCUMENTS

| | | | |
|---|---|---|---|
| 6,052,531 A | 4/2000 | Waldin, Jr. et al. | |
| 6,237,091 B1 | 5/2001 | Firooz et al. | |
| 6,493,871 B1 | 12/2002 | McGuire et al. | |
| 6,601,227 B1 | 7/2003 | Trimberger | |
| 6,618,857 B1 | 9/2003 | Zimniewicz et al. | |
| 6,633,878 B1 | 10/2003 | Underwood | |
| 6,639,910 B1 | 10/2003 | Provencher et al. | |

(Continued)

FOREIGN PATENT DOCUMENTS

| | | |
|---|---|---|
| WO | 2016/033785 A1 | 3/2016 |
| WO | 2018/160600 A2 | 9/2018 |

OTHER PUBLICATIONS

Faris Keti et al.; "Emulation of Software Defined Networks Using Mininet in Different Simulation Environments"; IEEE 6th International Conference on Intelligent Systems, Modelling and Simulation; pp. 205-210; Feb. 2015.

(Continued)

*Primary Examiner* — Lewis A Bullock, Jr.
*Assistant Examiner* — Mark A Gooray
(74) *Attorney, Agent, or Firm* — Chamberlain, Hrdlicka, White, Williams & Aughtry (57) ABSTRACT

Embodiments disclosed herein relate to method and systems for updating hardware tables. Such methods may include receiving a flexible pipeline definition from a controller at a compiler; generating, by the compiler, a hardware table update initial instruction set; and transmitting the hardware table update initial instruction set to a network device. The network device may use the hardware table initial instruction set to configure the network device to implement the flexible pipeline definition for a network chip.

14 Claims, 3 Drawing Sheets

(56) References Cited

U.S. PATENT DOCUMENTS

| | | | |
|---|---|---|---|
| 6,718,535 | B1 | 4/2004 | Underwood |
| 6,754,175 | B1 | 6/2004 | Akinpelu et al. |
| 6,948,099 | B1 | 9/2005 | Tallam |
| 7,062,567 | B2 | 6/2006 | Benitez et al. |
| 7,127,713 | B2 | 10/2006 | Davis et al. |
| 7,213,152 | B1 | 5/2007 | Gafken et al. |
| 7,483,370 | B1 | 1/2009 | Dayal et al. |
| 7,506,338 | B2 | 3/2009 | Alpern et al. |
| 7,849,454 | B2 | 12/2010 | Lambert et al. |
| 7,979,530 | B1 | 7/2011 | Lee |
| 8,171,466 | B2 | 5/2012 | Langen et al. |
| 8,219,794 | B1 | 7/2012 | Wang et al. |
| 8,448,162 | B2 | 5/2013 | Ramanathan et al. |
| 8,849,949 | B1 | 9/2014 | Pani |
| 8,943,491 | B2 | 1/2015 | Brogan et al. |
| 8,959,215 | B2 | 2/2015 | Koponen et al. |
| 9,042,402 | B1 | 5/2015 | Loganathan et al. |
| 9,106,581 | B1 | 8/2015 | Mackie et al. |
| 9,292,332 | B1 | 3/2016 | Liguori et al. |
| 9,880,829 | B2 | 1/2018 | Katiyar et al. |
| 9,940,148 | B1 | 4/2018 | Dannowski |
| 10,031,763 | B1 | 7/2018 | Siebenthaler |
| 10,079,781 | B2 | 9/2018 | Cheng et al. |
| 10,516,626 | B1* | 12/2019 | Kodeboyina ........... H04L 45/74 |
| 2004/0083476 | A1 | 4/2004 | Zhou et al. |
| 2005/0114852 | A1 | 5/2005 | Chen et al. |
| 2007/0220358 | A1 | 9/2007 | Goodill et al. |
| 2009/0277346 | A1 | 11/2009 | Godecke et al. |
| 2010/0199272 | A1 | 8/2010 | Mahajan et al. |
| 2012/0173691 | A1 | 7/2012 | Kothe et al. |
| 2012/0311112 | A1 | 12/2012 | Bender et al. |
| 2013/0282884 | A1 | 10/2013 | Chandrasekaran et al. |
| 2014/0033187 | A1 | 1/2014 | Beale |
| 2014/0086241 | A1 | 3/2014 | Assarpour |
| 2014/0207917 | A1* | 7/2014 | Tock .................. H04L 41/0816 709/220 |
| 2014/0269254 | A1 | 9/2014 | Choorakkot Edakkunni et al. |
| 2014/0337674 | A1 | 11/2014 | Ivancic et al. |
| 2015/0040115 | A1 | 2/2015 | Capper |
| 2015/0120905 | A1 | 4/2015 | Leogrande et al. |
| 2015/0149658 | A1 | 5/2015 | Wei |
| 2016/0013971 | A1 | 1/2016 | Caviglia et al. |
| 2016/0014023 | A1 | 1/2016 | He et al. |
| 2016/0094668 | A1 | 3/2016 | Chang et al. |
| 2016/0210135 | A1 | 7/2016 | Wroblewski et al. |
| 2016/0234104 | A1 | 8/2016 | Hoffmann |
| 2016/0308718 | A1 | 10/2016 | Lanka et al. |
| 2016/0315803 | A1 | 10/2016 | Sadana et al. |
| 2016/0342510 | A1 | 11/2016 | Pani |
| 2016/0352865 | A1 | 12/2016 | Gupta et al. |
| 2017/0063690 | A1* | 3/2017 | Bosshart .................. H04L 69/22 |
| 2017/0123779 | A1 | 5/2017 | Albot et al. |
| 2017/0168803 | A1 | 6/2017 | Katiyar et al. |
| 2018/0136940 | A1 | 5/2018 | Mallichan et al. |
| 2018/0139238 | A1 | 5/2018 | Schultz et al. |
| 2018/0239611 | A1 | 8/2018 | Hu et al. |
| 2019/0384580 | A1* | 12/2019 | Martini ................. H04W 76/12 |
| 2020/0028776 | A1* | 1/2020 | Atli ......................... H04L 45/64 |

OTHER PUBLICATIONS

Jim Bardgett et al. "nSwitching: Virtual Machine Aware Relay Hardware Switching to improve intra-NIC Virtual Machine Traffic"; IEEE ICC 2012—Next-Generation Networking Symposium; pp. 2700-2705; Jun. 10-15, 2012.

Luís Pina et al.; "Atomic Dynamic Upgrades Using Software Transactional Memory"; IEEE Press; Proceedings of the 4th International Workshop on Hot Topics in Software Upgrades (HotSWUp '12); pp. 21-25; Jun. 2012.

Sander van der Burg; "A Generic Approach for Deploying and Upgrading Mutable Software Components"; IEEE Press; Proceedings of the 4th International Workshop on Hot Topics in Software Upgrades (HotSWUp '12); pp. 26-30, Jun. 2012.

Daniel Cederman et al.; "Supporting Lock-Free Composition of Concurrent Data Objects: Moving Data between Containers"; IEEE Transactions on Computers; vol. 62, No. 9; pp. 1866-1878; Sep. 2013.

Katelin A. Bailey et al.; "Trusted Virtual Containers on Demand"; Proceedings of the 5th ACM Workshop on Scalable Trusted Computing (STC '10), ACM, Chicago, Illinois; pp. 63-72; Oct. 4, 2010.

Nikhil Handigol et al.; "Reproducible Network Experiments Using Container-Based Emulation"; Proceedings of the 8th International Conference on Emerging Networking Experiments and Technologies (CoNEXT '12), ACM, Nice, France pp. 253-264; Dec. 10-13, 2012.

Tudor Dumitras; "Dependable, Online Upgrades in Enterprise Systems"; Proceedings of the 24th ACM SIGPLAN Conference Companion on Object Oriented Programming Systems Languages and Applications (OOPSLA '09), ACM, Orlando, Florida; pp. 835-836; Oct. 25-29, 2009.

* cited by examiner

DYNAMIC RUN TIME PROGRAMMING OF HARDWARE TABLES

BACKGROUND

Networks of interconnected devices (e.g., computer networks) often include any number of network devices. Such network devices may include any number of network chips and/or other devices/components that include tables implemented in hardware (i.e., hardware tables). Such tables may need to be configured, re-configured, and/or updated from time to time. Often, such updates require updating the software on a network device to implement the changes in the configuration and/or content of the hardware tables, which may not be possible during continued network device operation and/or may interrupt device operations.

SUMMARY

In general, in one aspect, embodiments disclosed herein relate to a method for updating hardware tables. The method may include receiving a flexible pipeline definition from a controller at a compiler; generating, by the compiler, a hardware table update initial instruction set; and transmitting the hardware table update initial instruction set to a network device. The network device may use the hardware table initial instruction set to configure the network device to implement the flexible pipeline definition for a network chip.

In general, in one aspect, embodiments disclosed herein relate to a non-transitory computer readable medium comprising instructions that, when executed by a processor, perform a method updating a hardware table. The method may include receiving a flexible pipeline definition from a controller at a compiler; generating, by the compiler, a hardware table update initial instruction set; and transmitting the hardware table update initial instruction set to a network device. The network device may use the hardware table initial instruction set to configure the network device to implement the flexible pipeline definition for a network chip.

In general, in one aspect, embodiments disclosed herein relate to a system for updating hardware tables. The system may include a compiler comprising circuitry and configured to receive a flexible pipeline definition from a controller at the compiler; generate a hardware table update initial instruction set; and transmit the hardware table update initial instruction set to a network device. The network device may use the hardware table initial instruction set to configure the network device to implement the flexible pipeline definition for a network chip.

Other aspects of the invention will be apparent from the following description and the appended claims.

DETAILED DESCRIPTION

Specific embodiments will now be described with reference to the accompanying figures. In the following description, numerous details are set forth as examples of the invention. It will be understood by those skilled in the art, and having the benefit of this Detailed Description, that one or more embodiments of the present invention may be practiced without these specific details and that numerous variations or modifications may be possible without departing from the scope of the invention. Certain details known to those of ordinary skill in the art may be omitted to avoid obscuring the description.

In the following description of the figures, any component described with regard to a figure, in various embodiments of the invention, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention relate to systems and methods for translating a flexible definition of a network forwarding pipeline into a set of instructions that allow a network device to implement the forwarding pipeline for specific hardware (e.g., a network chip) with fixed table definitions. Specifically, in one or more embodiments of the invention, a compiler is configured to receive a flexible pipeline definition and, based on the contents therein, translate the definition into an instruction set that informs an agent executing on a network device what constructs to set up in order to facilitate network device hardware operation that complies with the flexible pipeline definition, and to facilitate runtime updates to contents of hardware tables of the hardware of the network device. In one or more embodiments of the invention, embodiments disclosed herein allow for the ability to dynamically map and/or program one or more hardware tables defined in the flexible pipeline definition by re-compiling the pipeline program and sending the re-compiled instruction set to the agent without the need to update or otherwise modify the software executing on the network device.

Figure 1:
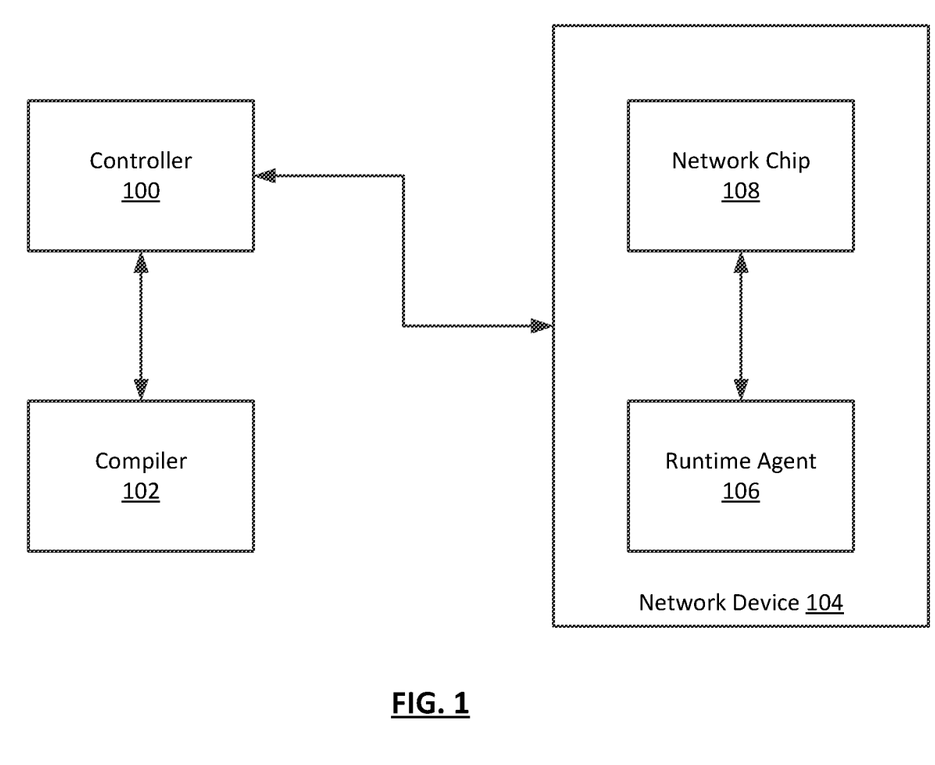
FIG. 1 shows a system in accordance with one or more embodiments of the invention.

FIG. 1 shows a system in accordance with one or more embodiments of the invention. As shown in FIG. 1, the system includes a controller (100), a compiler (102), and a network device (104). In one or more embodiments of the invention, the network device (104) includes a runtime agent (106) and a network chip (108). Each of these components is described below.

In one or more embodiments of the invention, a controller (100) is hardware (e.g., circuitry) and/or combination of hardware and software that includes functionality including, but not limited to, generating a program that includes a flexible pipeline definition. In one or more embodiments of the invention, a controller (100) is included as a part of a computing device and/or is operatively connected to a computing device. As used herein, the term operatively connected, or operative connection, means that there exists between elements/components/devices a direct or indirect connection that allows the elements to interact with one another in some way (e.g., via the exchange of information). For example, the phrase 'operatively connected' may refer to any direct (e.g., wired directly between two devices) or indirect (e.g., wired and/or wireless connections between any number of devices connecting the operatively connected devices) connection.

In one or more embodiments of the invention, a computing device is any device or any set of devices capable of electronically processing instructions and may include, but is not limited to, any of the following: one or more processors (not shown), memory (e.g., random access memory (RAM)) (not shown), input and output device(s) (not shown), persistent storage (not shown), one or more physical interfaces (e.g., network ports) (not shown), any number of other hardware components (not shown) or any combination thereof. Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer and/or any other mobile computing device), a network device (e.g., switch, router, multi-layer switch, etc.), a virtual machine, and/or any other type of computing device with the aforementioned requirements.

In one or more embodiments of the invention, a controller (100) includes functionality to receive computer programs obtained from any source (e.g., a P4 program) that describe flexible pipeline definitions, and to provide such programs to a compiler. In one or more embodiments, a controller (100) also includes functionality to receive/obtain a compiled instruction set that is based on the flexible pipeline definition from a compiler and/or to send the compiled instruction set to a target network device.

In one or more embodiments of the invention, a pipeline is a series of lookups and actions that are taken in order to process, at least in part, a network traffic data unit. In one or more embodiments of the invention, a forwarding pipeline is a pipeline that relates, at least in part, to forwarding network traffic data units. In one or more embodiments of the invention, the flexible pipeline definition defines at least a portion of a forwarding pipeline.

In one or more embodiments of the invention, forwarding a network traffic data unit relates to receiving a network traffic data unit at a network device, and processing the network traffic data unit in order to determine where to send the network traffic data unit. In one or more embodiments of the invention, a flexible pipeline definition, as related to network traffic data unit processing by a network device (described below) includes, but is not limited to, a series of table lookups (e.g., in hardware tables of a network device component such as a network chip), and corresponding actions (e.g., header manipulations) to be performed in relation to a received network traffic data unit.

In one or more embodiments of the invention, a flexible pipeline definition is expressed as instructions in a programming language. As an example, a flexible pipeline definition written as a program may include, but is not limited to, any or all of the following: instructions for parsing various headers of a network traffic data unit, instructions for assigning various identifiers to a network traffic data unit, instructions for de-encapsulation/encapsulation relating to various tunneling schemes, instructions for error checking, instructions for forwarding and/or routing operations, instructions relating to security features such as access control, etc.

In one or more embodiments of the invention, the controller (100) is operatively connected to a compiler (102). In one or more embodiments of the invention, a compiler (102) is hardware (e.g., circuitry) and/or combination of hardware and software that includes functionality including, but not limited to, compiling a program received in any programming language into instructions that may be used by a runtime agent for controlling, at least in part, the operation of a hardware component of a network device.

In one or more embodiments of the invention, a compiler (102) includes functionality to translate instructions written in a programming language into a different form that may be comprehended by certain hardware (e.g., a network device and/or network chip therein). In one or more embodiments of the invention, the compiler (102) executes as a portion of the same computing device as the controller (100). In other embodiments, the compiler (102) executes on a separate computing device that is operatively connected to the controller (100).

In one or more embodiments of the invention, the controller (100) is operatively connected to a network device (104). In one or more embodiments of the invention, a network device (104) may be a physical device that includes and/or is operatively connected to persistent storage (not shown), memory (e.g., random access memory (RAM)) (not shown), one or more processor(s) (e.g., integrated circuits) (not shown), and at least one physical network interfaces (which may also be referred to as ports). Examples of a network device include, but are not limited to, a network switch, a router, a multilayer switch, a fibre channel device, an InfiniBand® device, etc. A network device is not limited to the aforementioned specific examples.

In one or more embodiments of the invention, a network device (104) includes functionality to receive network traffic data units (e.g., frames, packets, tunneling protocol frames, etc.) at any of the physical network interfaces (i.e., ports) of the network device and to process the network traffic data units to determine whether to: (i) drop the network traffic data unit; (ii) process the network traffic data unit; and/or (iii) transmit the network traffic data unit, based on the processing, from a physical network interface or port on the network device in accordance with one or more embodiments of the invention.

In one or more embodiments of the invention, the network device (104) is part of a network (not shown). A network may be an entire network or any portion thereof (e.g., a logical portion of network devices within the network topology, external to the network topology, etc.). A network may include a datacenter network, a wide area network, a local area network, a wireless network, a cellular phone network, or any other suitable network that facilitates the exchange of information from one part of the network to another. In one or more embodiments, the network may be coupled with or overlap, at least in part, with the Internet.

In one or more embodiments of the invention, a network includes a collection of one or more network devices (e.g., network device (104) that facilitate network connectivity for one or more operatively connected devices (e.g., computing devices, data storage devices, other network devices, etc.). In one or more embodiments of the invention, the network device (104) and other devices within the network (not shown) are arranged in a network topology. In one or more embodiments of the invention, a network topology is an arrangement of various elements of a network.

In one or more embodiments of the invention, the controller (100) is operatively connected to any number of network devices within the network. In one or more embodiments of the invention, each network device (104) in the network is associated with one or more compilers (102) configured to compile programs from the controller into instructions that may be used by the network device to program hardware tables of components of the network device (104), and receipt of such instructions may be facilitated, at least in part, by a controller (100).

In one or more embodiments of the invention, the network device (104) includes any number of components (e.g., network chips, field programmable gate arrays (FPGAs), etc.) In one or more embodiments of the invention, a network chip (108) is any hardware (e.g., circuitry such as, for example, application specific integrated circuits (ASICs)), which may include software and/or firmware, that includes functionality related to receiving, processing, and/or transmitting network traffic data units in accordance with one or more embodiments of the invention.

In order to perform such functionality, a network chip (108) may include any number of components. Such components may include, but are not limited to, one or more processors, one or more buffers (e.g., for implementing receive and/or transmit queues, such as virtual output queues (VOQs)), any type or amount of non-volatile storage, and/or any type or amount of volatile storage (e.g., RAM). A network chip (108) may also include and/or be operatively connected to any number of physical network interfaces of a network device (104). Such interfaces may provide a path external to the network device (e.g., to other devices), and/or may be operatively connected to other components internal to the network device (104), and each such interface may be an ingress and/or egress interface.

In one or more embodiments of the invention, a network chip (108) also includes storage (not shown) for storing tables (not shown) implemented in the hardware of the network chip (i.e., hardware tables). Such tables may control, at least in part, various aspects of the operation of a network chip, such as functionality related to network traffic data unit forwarding.

As a non-limiting example, a network chip may be and/or include an ASIC that receives network traffic data units at an ingress port, and, so long as no security policy indicates the network traffic data units should be dropped, determines out of which egress port on the network device (100) to forward the network traffic data units such as, for example, media access control (MAC) frames that include Internet Protocol (IP) packets.

Such functionality may be implemented, at least in part, by a series of lookups and/or actions as defined by the controller (100) in a program, compiled by the compiler (102), transmitted as instructions by the controller (100) to the network device (104), and implemented by a runtime agent (106) executing on the network device (104) to program and update hardware tables (not shown) of a network chip (108).

In one or more embodiments of the invention, a network device or computing device also includes software and/or firmware stored in any device storage (not shown) and/or device memory (not shown) (i.e., non-transitory computer readable mediums).

Such software may include instructions which, when executed by the one or more processors (not shown) of a device, cause the one or more processors to perform operations in accordance with one or more embodiments of the invention.

The software instructions may be in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium.

Specifically, the software instructions may correspond to computer readable program code that when executed by a processor(s), is configured to perform functionality related to embodiments of the invention.

The functionality of a network device, computing device, controller, and/or compiler is not limited to the aforementioned examples.

In one or more embodiments of the invention, the network device (104) also includes a runtime agent (106). In one or more embodiments of the invention, a runtime agent (106) is a collection of any one or more software agents executing on hardware (e.g., circuitry) of the network device (104). A runtime agent (106) may execute within an operating system environment (not shown) of the network device (104). A runtime agent (106) may include functionality to receive compiled instructions from a controller (100), and to use the instructions to configure and update hardware tables of network chips of the network device (104). In one or more embodiments of the invention, the runtime agent (106) includes one agent for receiving the instructions, and other agents for specifically interacting with a network chip.

While FIG. 1 shows a configuration of components, other configurations may be used without departing from the scope of the invention. For example, there may be any number of controllers. As another example, each controller may include and/or be operatively connected to any number of compilers. As another example, any compiler may be associated with any number of network devices, or any portion thereof. As another example, there may be any number of network devices. As another example, there may be any number of components, such as network chips, in a given network device. Accordingly, embodiments disclosed herein should not be limited to the configuration of components shown in FIG. 1.

Figure 2:
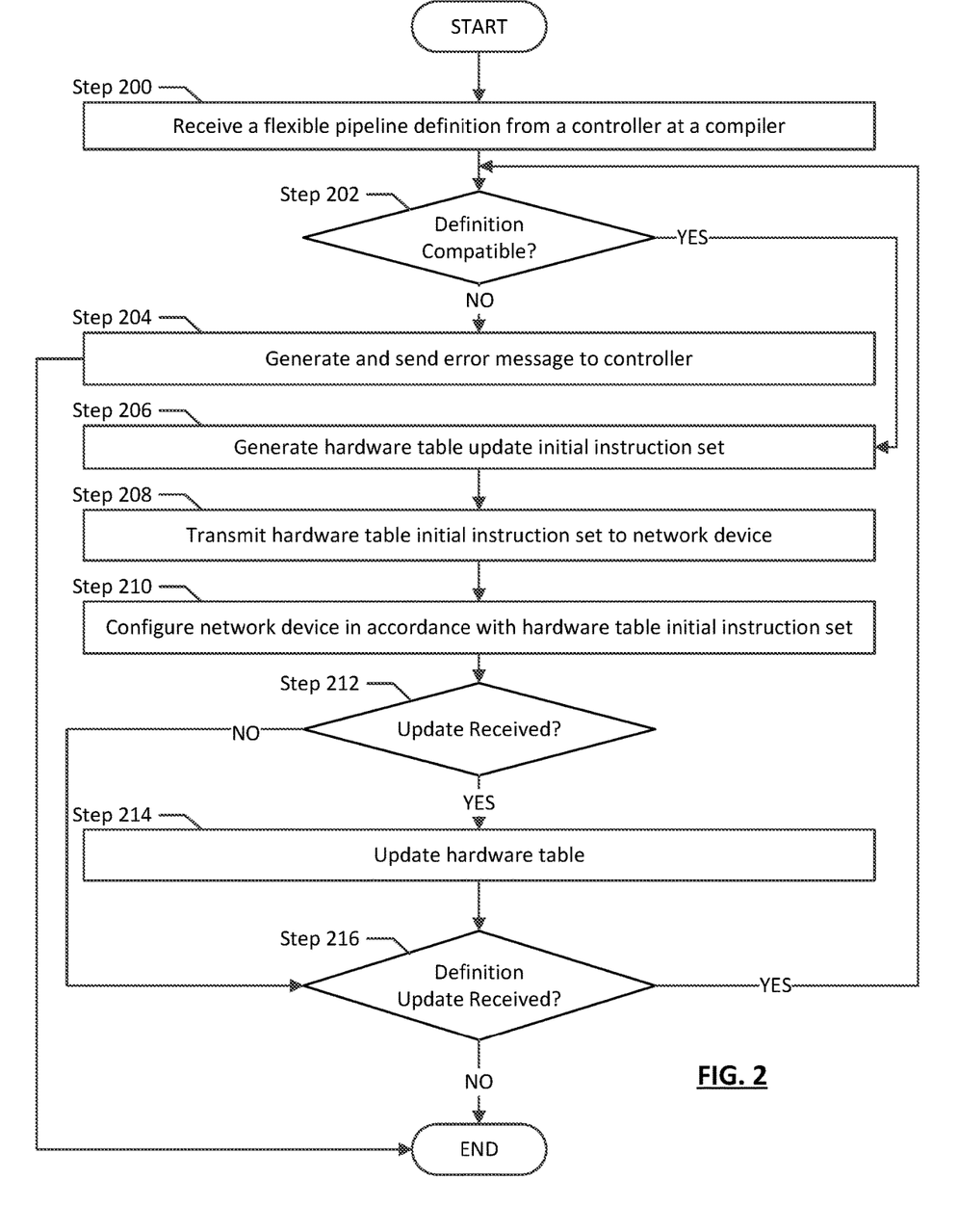
FIG. 2 shows a flowchart in accordance with one or more embodiments of the invention.

FIG. 2 shows a flowchart describing a method for dynamic programming of hardware tables of a network device component. While the various steps in this flowchart are presented and described sequentially, one of ordinary skill in the relevant art will appreciate that some or all of the steps may be executed in different orders, may be combined or omitted, and some or all of the steps may be executed in parallel.

In Step 200, a flexible pipeline definition is received at a compiler from a controller. In one or more embodiments of the invention, a controller seeking to program hardware tables of a network device (or components therein) obtains, receives, or generates a program that includes a flexible pipeline definition. As discussed above, a flexible pipeline definition defines various aspects of a pipeline through which a network traffic data unit traverses once received by a network device. Such aspects may include, but are not limited to, parsing identifier assignments, various computations based on the contents of a network traffic data unit, tunneling scheme manipulations, forwarding lookups, security lookups, etc. In one or more embodiments of the invention, the flexible pipeline definition also includes any required table definitions to be implemented as hardware tables on target network device hardware, and a hints file that may be used to associate table definitions within the forwarding pipeline definition with hardware tables of network device components.

The flexible pipeline definition may be received by the compiler via any manner of conveying a program to a compiler. For example, if the compiler is executing on the same computing device as the controller, the program may be passed to the compiler by storing a copy of the program in memory or storage and alerting the compiler that the program including the flexible pipeline definition is present. As another example, if the compiler is executing on a separate computing device than the compiler, the program including the flexible pipeline definition may be transmitted over an operative connection from the computing device of the controller to the computing device of the compiler.

In Step 202, a determination is made whether the flexible pipeline definition is compatible with hardware with which the compiler is associated. In one or more embodiments of the invention, the compiler is configured to compile flexible pipeline definitions for one or more specific network device components that include hardware tables. In one or more embodiments of the invention, if the flexible pipeline definition included in the program provided to the compiler is not compatible with a specific network device component with which the compiler is associated, the compiler is unable to compile the program effectively. In such a scenario, the method proceeds to Step 204. If, on the other hand, the compiler determines that the flexible pipeline definition is compatible with the specific network device component with which the compiler is associated, the method proceeds to Step 206.

In Step 204, an error message is generated by the compiler and sent to the controller. In one or more embodiments of the invention, when the flexible pipeline definition in the program sent by the compiler is incompatible with the specific network device component with which the compiler is associated, the compiler generates an error message that is sent to the controller to alert the controller that the attempted programming has failed.

In Step 206, based on a determination in Step 202 that the flexible program definition provided by the controller is compatible with the hardware with which the compiler is associated, the compiler generates a hardware table update initial instruction set, which is an instruction set compiled using the flexible pipeline definition that is intended to function with the intended network device hardware.

In one or more embodiments of the invention, the compiler uses the program that includes the flexible pipeline definition to generate the hardware table update initial instruction set. In one or more embodiments of the invention, the program includes both the flexible pipeline definition and a hints file (which may be considered a part of the flexible pipeline definition). In one or more embodiments of the invention, a hints file allows the compiler to associate entities defined in the program to the hardware constructs in the target component of the network device. In one or more embodiments of the invention, this mapping is needed to generate the compiler output that contains the collections of target-specific constructs to initialize and configure the network device component.

In one or more embodiments of the invention, the compiler is configured with a forwarding pipeline model. In one or more embodiments of the invention, the forwarding pipeline model is an abstraction of a pipeline that would be used in many network device components to facilitate network traffic data unit forwarding by a network device. In one or more embodiments of the invention, the hints file allows the compiler to associate information included in the flexible pipeline definition with aspects of the forwarding pipeline model. In one or more embodiments of the invention, once the forwarding pipeline definition has been mapped to the forwarding pipeline model, the mapped model may be further compiled into hardware target specific instructions to be transmitted to a network device to be implemented on a network device component.

In Step 208, the hardware table initial instruction set is transmitted (e.g., by a controller) to a network device that includes a component to be configured based on the forwarding pipeline definition. In one or more embodiments of the invention, the hardware table initial instruction set is transmitted using any mechanism of conveying information to the network device. For example, the hardware table initial instruction set may be sent to the network device as one or more network traffic data units that are received by the network device and conveyed to a runtime agent executing thereon.

In Step 210, the network device is configured in accordance with the hardware table initial instruction set. In one or more embodiments of the invention, the configuration is performed, at least in part, by the runtime agent. In one or more embodiments of the invention, the instructions received by the runtime agent include table definitions, which the runtime agent maps to one or more hardware tables of a network device component.

In one or more embodiments of the invention, the hardware tables of the network device component are known by the runtime agent, as are a set of tables corresponding to the hardware tables that are configured to receive updates that are conveyed to the actual hardware tables. In response to receiving the hardware table initial instruction set from the compiler, the runtime agent may create an association between the tables defined therein with the set of tables corresponding to the hardware tables, so that an update to such tables causes an update to the hardware tables of a component of the network device. In one or more embodiments of the invention, the forwarding pipeline definition is stored in storage of the network device by the runtime agent before being mapped to the underlying network device component that the forwarding pipeline definition is intended to program.

In Step 212, a determination is made as to whether an update to a hardware table of a network device component of a network device has been received by a runtime agent executing on the network device. Such an update may be, for example, an update to a field in such a hardware table (e.g., a field in a forwarding table entry). In one or more embodiments of the invention, if an update is not received, the method proceeds to Step 216. If, on the other hand, an update has been received, the method proceeds to Step 214.

In Step 214, based on the determination made in Step 212 that an update has been received, a hardware table of a component of a network device is updated to include new information. In one or more embodiments of the invention, the update is received as a query in a database query format that triggers the runtime agent to update a representation of a hardware table with the new information. In one or more embodiments of the invention, the update of the table representation triggers an agent associated with the hardware component that includes the to-be-update hardware table to convey the update to the hardware table of the component, thereby facilitating the update of such a table.

In Step 216, a determination is made whether an updated flexible pipeline definition is received by the controller. In one or more embodiments of the invention, flexible pipeline definitions may be modified over time to include new or different features of a network device hardware component, which may require an updated flexible pipeline definition. If no such update is received, the process ends. If, on the other hand, a definition update is received, the process returns to Step 202 (described above).

Figure 3:
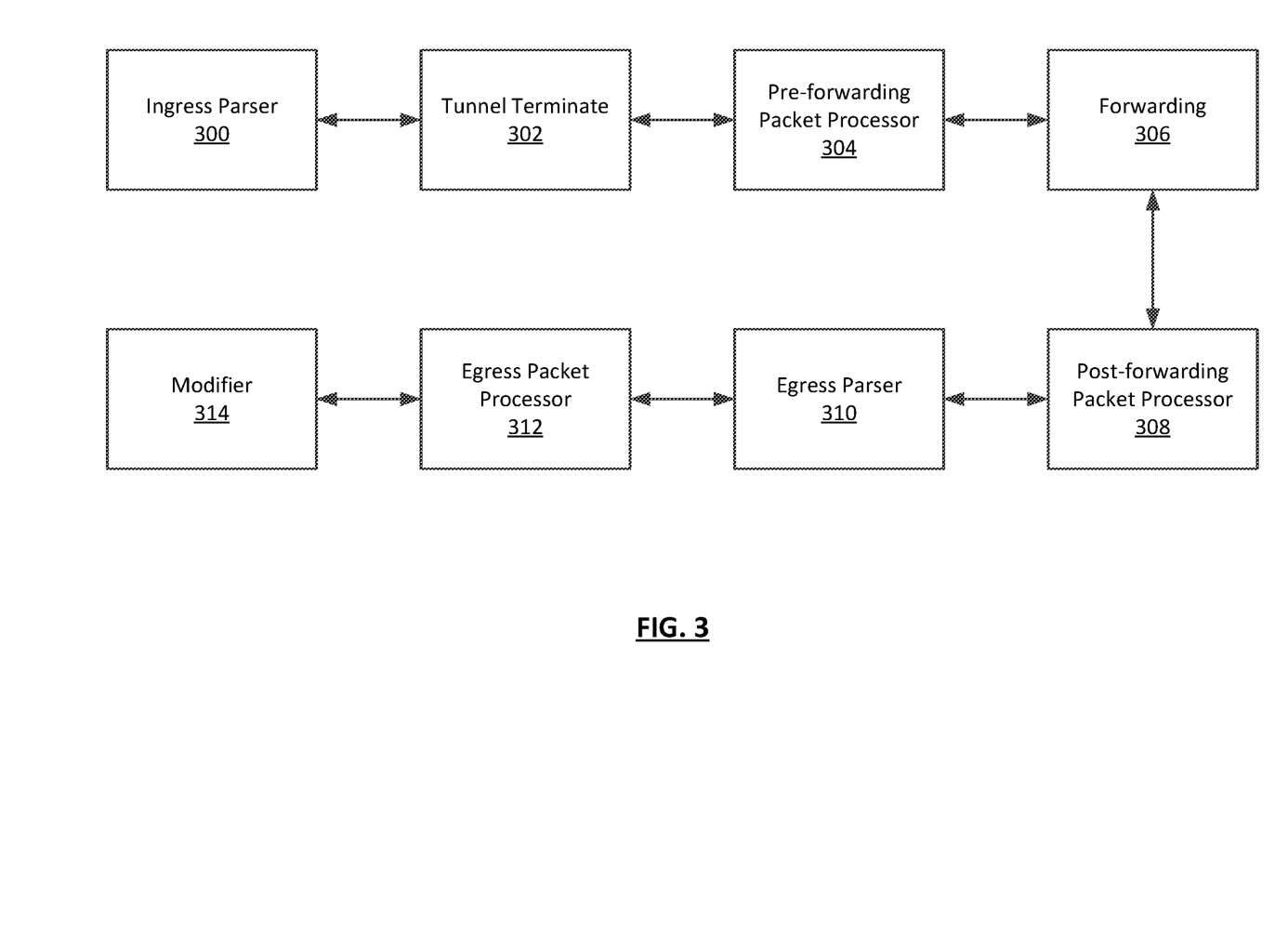
FIG. 3 shows an example in accordance with one or more embodiments of the invention.

FIG. 3 shows an example in accordance with one or more embodiments of the invention. The following example is for explanatory purposes only and not intended to limit the scope of the invention.

Referring to FIG. 3, consider a scenario in which a controller provides to a compiler a program that includes a forwarding pipeline definition. In one or more embodiments of the invention, the forwarding pipeline definition includes a definition of hardware tables needed to implement the forwarding pipeline definition on an ASIC-based network chip of a network device, as well as a hints file that allows the compiler to create instructions that allow a runtime agent on a network device to associate tables from the definition with hardware tables of a network device component. In one or more embodiments of the invention, the ASIC includes several hardware tables used during the process of forwarding network traffic data units.

In one or more embodiments of the invention, the forwarding pipeline definition includes descriptions of key and action fields. In one or more embodiments of the invention, the compiler includes a model of various stages of the pipeline to which the descriptions/definitions of the forwarding pipeline definition corresponds. In the example shown in FIG. 3, the model includes eight stages.

The first stage is an ingress parser (300). In one or more embodiments of the invention, the ingress parser is a construct that allows the runtime agent to parse the information included in a received network traffic data unit into discrete portions, each of which may be used during further processing pf the network traffic data unit.

The second stage is a tunnel terminate stage (302). In one or more embodiments of the invention, the tunnel terminate stage (302) is used to terminate a tunnel for a network traffic data unit. In one or more embodiments of the invention, this stage requires a table that includes information such as source and destination IP address, tunnel type, payload type, size, etc.

The third stage is a pre-forwarding packet processor (304). In one or more embodiments of the invention, a pre-forwarding packet processor requires examining layer 2 headers and/or layer three headers of the network traffic data unit to determine what action should be taken next with regards to the network traffic data unit.

The fourth stage is a forwarding stage (306). In one or more embodiments of the invention, the forwarding stage, based on the pre-forwarding packet processing, determines where the network traffic data unit is to be forwarded. In one or more embodiments of the invention, such a stage may include determining out of which network device interface the network traffic data unit is to be forwarded and/or what other component within a network device the network traffic data unit should be sent to facilitate proper forwarding.

The fifth stage is a post-forwarding packet processor stage (308). In one or more embodiments of the invention, the post-forwarding packet processor stage (308) performs any post forwarding packet processing necessary to facilitate proper forwarding of the network traffic data unit from an appropriate egress interface.

The sixth stage is an egress parser (310). In one or more embodiments of the invention, the egress parser (310) is configured to process the to-be-forwarded network traffic data unit to determine where the network traffic data unit should go next within the forwarding pipeline. Such a determination may be made, for example, based on information added to or modified within one or more headers of the network traffic data unit previously as it traversed the pipeline.

The seventh stage of the forwarding pipeline is the egress packet processor (312). In one or more embodiments of the invention, the egress packet processor (312) includes functionality to perform one or more lookups based on information included in the to-be-sent network traffic data unit in order to determine if any further processing of said network traffic data unit is required to send the packet to an egress interface for transmission towards a destination.

In one or more embodiments of the invention, the final stage is a modifier stage (314). In one or more embodiments of the invention, a modifier stage determines if any additional modifications need to be made to the network traffic data unit prior to transmission towards a destination. Such modifications may include, but are not limited to, re-encapsulation for further tunneling, addition or modification of headers for various protocols, etc.

In one or more embodiments of the invention, the compiler associates the table definitions included in the flexible pipeline definition from the controller with hardware tables of an ASIC of a network chip of the network device. In one or more embodiments of the invention, such an association is expressed in a series of instructions generated by the compiler compiling the flexible pipeline definition.

In one or more embodiments of the invention, the runtime agent then maps the hardware tables as included in the instructions representing the flexible pipeline definition with actual hardware tables of the relevant network device component(s).

Once the configuration of tables corresponding to network device component hardware tables is completed, the runtime agent is prepared to accept updates to the hardware tables of network device components. For example, once an update is received to a forwarding table entry, the update may be received via a database query. Such a database query may cause the runtime agent to update a data construct associated with a hardware table of the component to be updated. The update may then, in turn, trigger an update of an appropriate table that leads to an update of the relevant hardware table.

Embodiments of the invention described above allow for a flexible pipeline definition to be translated into an instruction set for programming a fixed hardware component to operate as defined by the flexible pipeline definition.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for updating hardware tables, the method comprising:
   receiving a flexible pipeline definition from a controller at a compiler, wherein the flexible pipeline definition includes table definitions for a target network device;
   generating, by the compiler, a hardware table initial instruction set for the target network device by, compiling the received flexible pipeline definition;

transmitting the hardware table initial instruction set to a runtime agent executing on the target network device,
wherein the runtime agent uses the hardware table initial instruction set to configure the network device to implement the flexible pipeline definition for a network chip, by:
creatine an association between the table definitions defined within the hardware table initial instruction set with one or more hardware tables of the network chip;
after configuring the target network device using the hardware table initial instruction set, receiving at the runtime agent an update to the one or more hardware tables of the target network device, wherein the update is received as a query; and
the runtime agent, in response to receiving the query, automatically executes the query to update the hardware tables of the network chip.

2. The method of claim 1, wherein the flexible pipeline definition comprises a hints file that associates flexible pipeline information of the flexible pipeline definition with a forwarding pipeline model.

3. The method of claim 2, wherein generating the hardware table initial instruction set comprises using the hints file to associate the flexible pipeline information with a hardware table of the network chip in the hardware table initial instruction set.

4. The method of claim 1, further comprising:
receiving a second flexible pipeline definition from the controller at the compiler;
determining that the second flexible pipeline definition is not compatible with a software version executing on the network device; and
generating, in response to the determination, an error message that is sent to the controller.

5. The method of claim 1, wherein the flexible pipeline definition is expressed as a P4 program.

6. A non-transitory computer readable medium comprising instructions that, when executed by a processor, perform a method updating a hardware table, the method comprising:
receiving a flexible pipeline definition from a controller at a compiler, wherein the flexible pipeline definition includes table definitions for a target network device;
generating, by the compiler, a hardware table initial instruction set for the target network device by, compiling the received flexible pipeline definition;
transmitting the hardware table initial instruction set to a runtime agent executing on the target network device,
wherein the runtime agent uses the hardware table initial instruction set to configure the network device to implement the flexible pipeline definition for a network chip, by:
creating an association between the table definitions defined within the hardware table initial instruction set with one or more hardware tables of the network chip;
after configuring the target network device using the hardware table initial instruction set, receiving at the runtime agent an update to the one or more hardware tables of the target network device, wherein the update is received as a query; and
the runtime agent, in response to receiving the query, automatically executes the query to update the hardware tables of the network chip.

7. The non-transitory computer readable medium of claim 6, wherein the flexible pipeline definition comprises a hints file that associates flexible pipeline information of the flexible pipeline definition with a forwarding pipeline model.

8. The non-transitory computer readable medium of claim 7, wherein generating the hardware table initial instruction set comprises using the hints file to associate the flexible pipeline information with a hardware table of the network chip in the hardware table initial instruction set.

9. The non-transitory computer readable medium of claim 6, wherein the method further comprises:
receiving a second flexible pipeline definition from the controller at the compiler;
determining that the second flexible pipeline definition is not compatible with a software version executing on the network device; and
generating, in response to the determination, an error message that is sent to the controller.

10. The non-transitory computer readable medium of claim 6, wherein the flexible pipeline definition is expressed as a P4 program.

11. A system for updating hardware tables, the system comprising: a compiler comprising circuitry and configured to:
receiving a flexible pipeline definition from a controller at a compiler, wherein the flexible pipeline definition includes table definitions for a target network device;
generating, by the compiler, a hardware table initial instruction set for the target network device by, compiling the received flexible pipeline definition;
transmit the hardware table initial instruction set to a runtime agent executing on the target network device,
wherein the network device uses the hardware table initial instruction set to configure the network device to implement the flexible pipeline definition for a network chip, by:
creating an association between the table definitions defined within the hardware table initial instruction set with one or more hardware tables of the network chip;
after configuring the target network device using the hardware table initial instruction set, receiving at the runtime agent an update to the one or more hardware tables of the target network device, wherein the update is received as a query; and
the runtime agent, in response to receiving the query, automatically executes the query to update the hardware tables of the network chip.

12. The system of claim 11, wherein the flexible pipeline definition comprises a hints file that associates flexible pipeline information of the flexible pipeline definition with a forwarding pipeline model.

13. The system of claim 12, wherein generating the hardware table initial instruction set comprises using the hints file to associate the flexible pipeline information with a hardware table of the network chip in the hardware table initial instruction set.

14. The system of claim 11, wherein the compiler is further configured to:
receive a second flexible pipeline definition from the controller at the compiler;
determine that the second flexible pipeline definition is not compatible with a software version executing on the network device; and
generate, in response to the determination, an error message that is sent to the controller.

* * * * *

UNITED STATES PATENT AND TRADEMARK OFFICE
CERTIFICATE OF CORRECTION

| | |
|---|---|
| PATENT NO. | : 11,301,231 B2 |
| APPLICATION NO. | : 16/377148 |
| DATED | : April 12, 2022 |
| INVENTOR(S) | : Prasanna Parthasarathy, Kenneth James Duda and Simon Francis Capper |

It is certified that error appears in the above-identified patent and that said Letters Patent is hereby corrected as shown below:

On the Title Page

Item [54], and in the Specification, Column 1, Line 1, delete "DYNAMIC RUN TIME PROGRAMMING OF HARDWARE TABLES" and insert -- DYNAMIC RUNTIME PROGRAMMING OF HARDWARE TABLES --.

In the Claims

Claim 1, Column 11, Line 7, the word "creatine" should read -- creating --.

Claim 1, Column 11, Line 16, the word "executes" should read -- execute --.

Signed and Sealed this
Twenty-fifth Day of October, 2022

*Katherine Kelly Vidal*

Katherine Kelly Vidal
*Director of the United States Patent and Trademark Office*